United States Patent
Wang et al.

(10) Patent No.: US 12,368,079 B2
(45) Date of Patent: Jul. 22, 2025

(54) METHOD FOR MANUFACTURING ELECTRONIC DEVICE

(71) Applicant: InnoLux Corporation, Miao-Li County (TW)

(72) Inventors: Cheng-Chi Wang, Miao-Li County (TW); Tzu-Yen Chiu, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 368 days.

(21) Appl. No.: 17/958,424

(22) Filed: Oct. 2, 2022

(65) Prior Publication Data

US 2024/0071840 A1 Feb. 29, 2024

(30) Foreign Application Priority Data

Aug. 25, 2022 (CN) .......................... 202211027731.6

(51) Int. Cl.
*H01L 21/66* (2006.01)
*H01L 21/56* (2006.01)
*H01L 23/00* (2006.01)

(52) U.S. Cl.
CPC ............ *H01L 22/20* (2013.01); *H01L 21/561* (2013.01); *H01L 21/568* (2013.01); *H01L 24/11* (2013.01); *H01L 24/19* (2013.01); *H01L 2224/117* (2013.01); *H01L 2224/11901* (2013.01); *H01L 2924/1011* (2013.01)

(58) Field of Classification Search
CPC ....... H01L 21/561; H01L 24/11; H01L 24/19; H01L 2224/117; H01L 2924/1011
See application file for complete search history.

(56) References Cited

U.S. PATENT DOCUMENTS

| | | | |
|---|---|---|---|
| 9,653,445 B2 | 5/2017 | Lin | |
| 2004/0051550 A1* | 3/2004 | Ma | G01R 31/2884 324/762.03 |
| 2005/0208735 A1* | 9/2005 | Noma | H01L 23/3114 257/E23.179 |
| 2005/0225347 A1* | 10/2005 | Khandros | G01R 1/0491 324/754.03 |
| 2008/0191728 A1* | 8/2008 | Attalla | G01R 31/31721 257/E23.001 |
| 2009/0011539 A1* | 1/2009 | Jeng | H01L 22/34 438/107 |
| 2016/0161548 A1* | 6/2016 | Mikkola | G01R 31/2818 324/750.01 |
| 2018/0151502 A1* | 5/2018 | Lin | H01L 23/5286 |
| 2019/0080971 A1* | 3/2019 | Hsu | H01L 22/34 |
| 2020/0227395 A1 | 7/2020 | Shi | |
| 2021/0257244 A1* | 8/2021 | Or-Bach | H01L 29/78672 |

FOREIGN PATENT DOCUMENTS

| | | |
|---|---|---|
| CN | 108122861 A | 6/2018 |
| TW | 201531718 A | 8/2015 |
| TW | 202029526 A | 8/2020 |

* cited by examiner

*Primary Examiner* — Mohammad M Choudhry
(74) *Attorney, Agent, or Firm* — Winston Hsu

(57) ABSTRACT

A method for manufacturing an electronic device includes: providing a base layer, wherein the base layer includes a plurality of first dies and a plurality of second dies, and a number of the plurality of first dies is greater than a number of the plurality of second dies; forming a circuit layer on the base layer; and performing an electricity test to confirm whether the circuit layer is electrically connected to one of the plurality of second dies.

18 Claims, 7 Drawing Sheets

METHOD FOR MANUFACTURING ELECTRONIC DEVICE

BACKGROUND OF THE DISCLOSURE

1. Field of the Disclosure

The present disclosure relates to a method for manufacturing an electronic device, and more particularly to a method for manufacturing an electronic device with performing an electricity test to a die.

2. Description of the Prior Art

In the current technology, the manufacture and production of some electronic devices often include the process of packaging electronic elements. However, the circuit design of electronic elements is complex and changeable, so how to monitor the performance or condition of the process and confirm the quality of products during the manufacturing process is an urgent issue to be discussed. In addition, if relevant tests are directly performed to the electronic elements, the electronic elements may be damaged, thus affecting the quality of products.

SUMMARY OF THE DISCLOSURE

One of objectives of the present disclosure is to provide a method for manufacturing an electronic device, so as to solve the problems encountered by the conventional manufacturing methods of electronic devices, and monitor the performance or condition of the process during the manufacturing process, thereby improving the quality and/or reliability of products.

An embodiment of the present disclosure provides a method for manufacturing an electronic device. The method includes: providing a base layer, wherein the base layer includes a plurality of first dies and a plurality of second dies, and a number of the plurality of first dies is greater than a number of the plurality of second dies; forming a circuit layer on the base layer; and performing an electricity test to confirm whether the circuit layer is electrically connected to one of the plurality of second dies.

These and other objectives of the present disclosure will no doubt become obvious to those of ordinary skill in the art after reading the following detailed description of the embodiment that is illustrated in the various figures and drawings.

DETAILED DESCRIPTION

Figure 1:
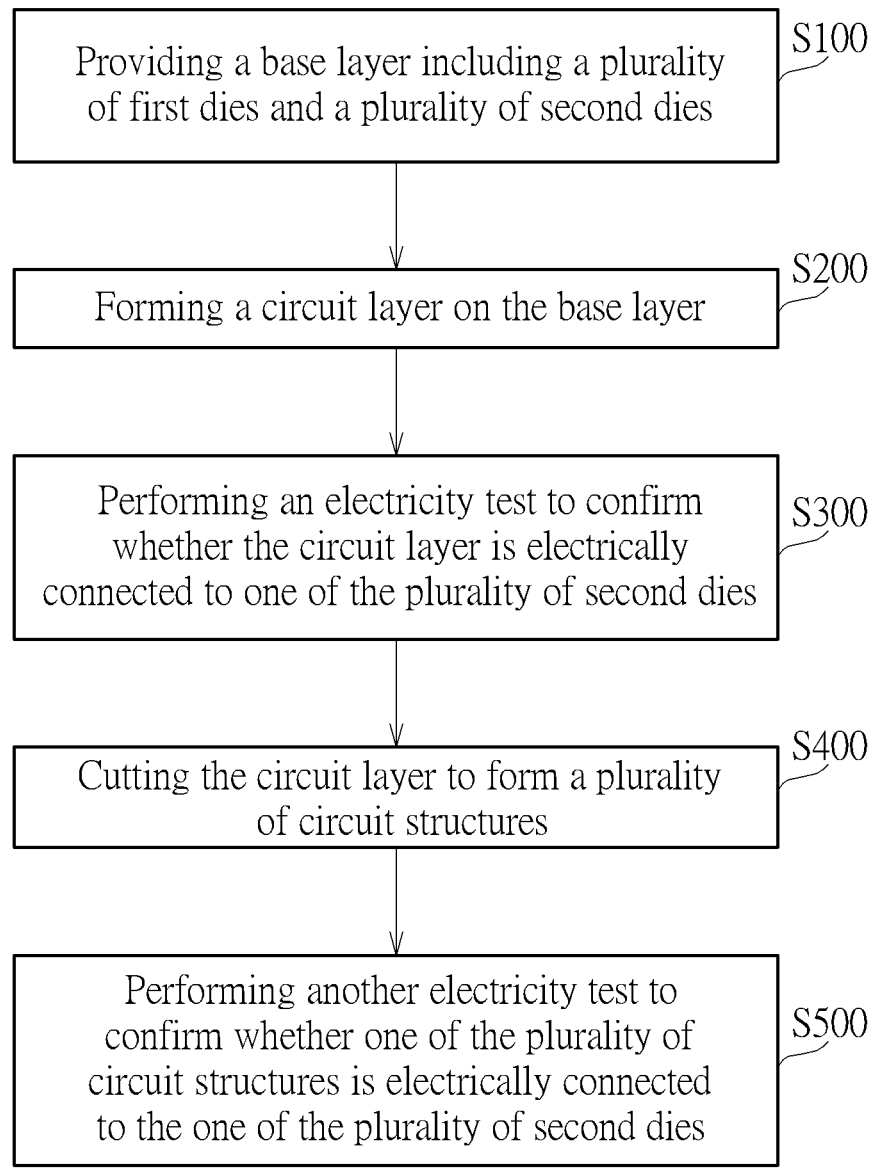
FIG. 1 is a flowchart of a method for manufacturing an electronic device according to an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The directional terms mentioned in this document, such as "up", "down", "front", "back", "left", "right", etc., are only directions referring to the drawings. Therefore, the directional terms used are for illustration, not for limitation of the present disclosure.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

The electronic device of the present disclosure may include a semiconductor package, a light-emitting device, a display device, a backlight device, an antenna device, a sensing device, a radar device or a tiled device, but not limited herein. The electronic device may include a bendable or flexible electronic device. The display device may include a non-self-emissive display device or a self-emissive display device. The antenna device may include a liquid-crystal type antenna device or an antenna device other than liquid-crystal type, and the sensing device may include a sensing device used for sensing capacitance, light, heat, X-rays, microwaves or ultrasonic waves, but not limited herein. The electronic device may include electronic elements such as passive elements and active elements, for example, capacitors, resistors, inductors, diodes, transistors, etc. The tiled device may be, for example, a display tiled device or an antenna tiled device, but not limited herein. It should be noted that the electronic device may be any arrangement and combination of the above, but not limited herein.

It should be noted that the technical features in different embodiments described in the following can be replaced, recombined, or mixed with one another to constitute another embodiment without departing from the spirit of the present disclosure.

Figure 2:
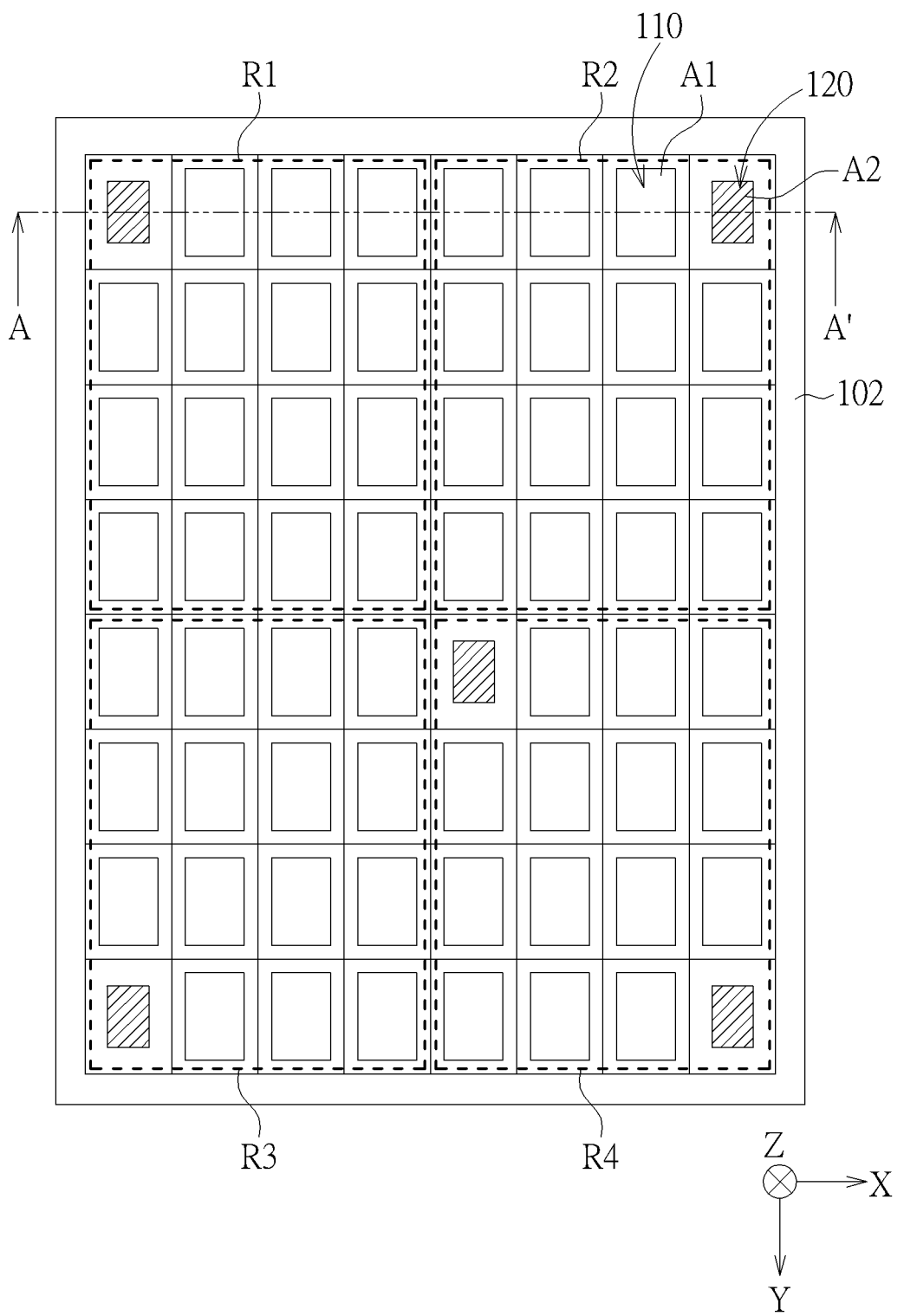
FIG. 2 is a top-view schematic diagram of first dies and second dies on a carrier according to an embodiment of the present disclosure.

Please refer to FIG. 1, FIG. 2 and FIG. 3 to FIG. 6. FIG. 1 is a flowchart of a method for manufacturing an electronic device according to an embodiment of the present disclosure. FIG. 2 is a top-view schematic diagram of first dies and second dies disposed on a carrier in a method for manufacturing an electronic device according to an embodiment of the present disclosure. FIG. 3 to FIG. 6 are schematic diagrams illustrating the process of a method for manufacturing an electronic device according to an embodiment of the present disclosure, wherein FIG. 3 to FIG. 6 are process schematic diagrams, for example, along the section line A-A' of FIG. 2. As shown in FIG. 1, FIG. 2 and FIG. 3 to FIG. 6, a method for manufacturing an electronic device according to an embodiment of the present disclosure may include Step S100 to Step S300, and may further optionally include Step S400 and Step S500, as detailed in the following. As shown in Step S100 and FIG. 2 to FIG. 4, a base layer 100 is provided at first, wherein the base layer 100 may include a plurality of first dies 110 and a plurality of second dies 120, and a number of the plurality of first dies 110 is greater than a number of the plurality of second dies 120. The process of the electronic device in the present disclosure may be applied to, for example, a panel-level package (FOPLP) process, and may be a chip-first process, but not limited herein. The first die 110 and/or the second die 120 may include, for example, a diode or a semiconductor die, but not limited herein. The diode may include, for example, a light-emitting diode or a photodiode. For example, the light-emitting diode may include, an organic light-emitting diode (OLED), a mini light-emitting diode (mini LED), a micro light-emitting diode (micro LED), a quantum dot light-emitting diode (quantum dot LED), but not limited herein. A die may include a known good die (KGD), which may include various electronic elements, such as (but not limited to) wires, transistors, etc. In the embodiments of the present disclosure, the first die 110 may be a main die or a product die, and the second die 120 may be a dummy die, but not limited herein.

Figure 4:
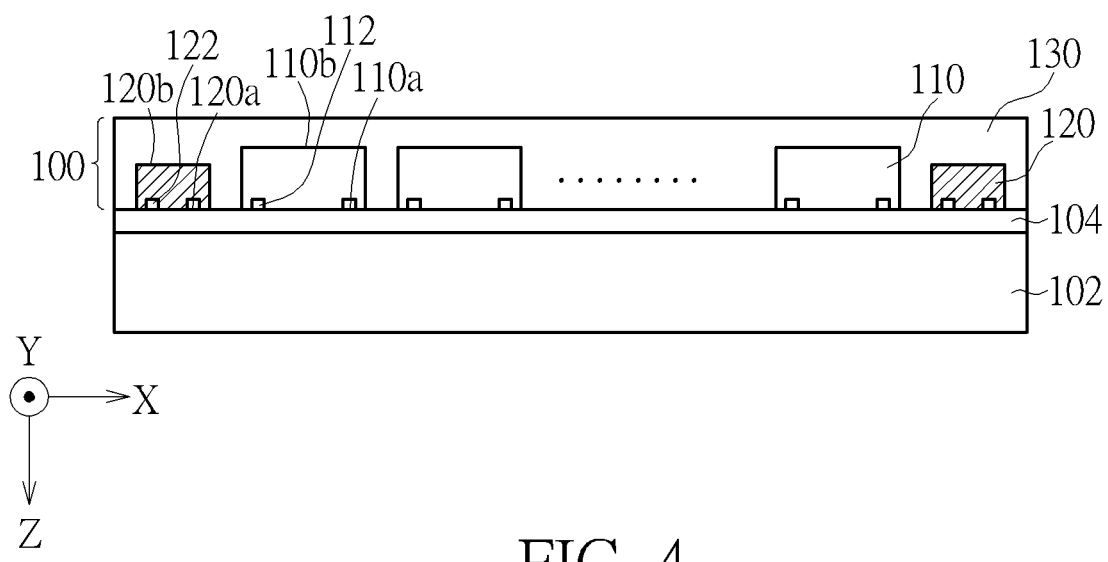

In some embodiments, the base layer 100 may further include a protective layer 130 (as shown in FIG. 4), and the protective layer 130 may surround the plurality of first dies 110 and the plurality of second dies 120 to isolate moisture and air and/or reduce damage to dies. The "surround" herein may mean that in a cross-sectional schematic diagram, the protective layer 130 contacts at least one surface of the first die 110 and the second die 120, such as covering the side surface and/or the top surface of the die. The protective layer 130 may include, for example, epoxy, poly(methyl methacrylate) (PMMA), polydimethylsiloxane (PDMS), ceramic, other suitable materials or combinations of the above materials, but not limited herein.

Figure 3:
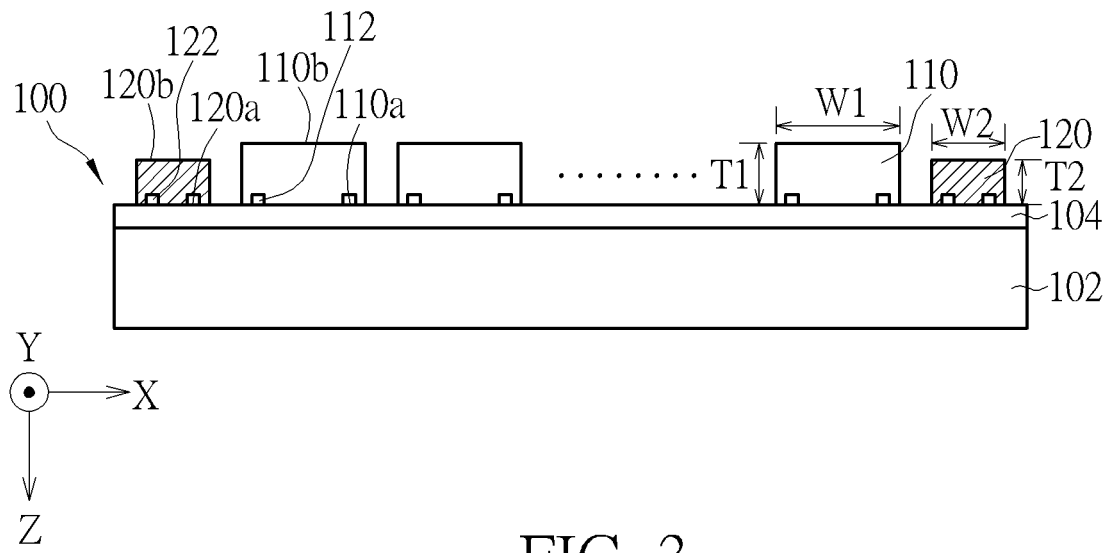
FIG. 3 to FIG. 6 are schematic diagrams illustrating the process of a method for manufacturing an electronic device according to an embodiment of the present disclosure.

Specifically, the process of forming the base layer 100 may for example include the following steps. At first, as shown in FIG. 2 and FIG. 3, the plurality of first dies 110 and the plurality of second dies 120 are disposed on a carrier 102. For example, the plurality of first dies 110 and the plurality of second dies 120 may be attached to the carrier 102 through a release layer 104 disposed on the carrier 102, and the number of the first dies 110 disposed on the carrier 102 is greater than the number of the second dies 120 disposed on the carrier 102. The carrier 102 may include transparent material, opaque material or translucent material, such as including glass, ceramic, stainless steel, composite material or other suitable materials, but not limited herein. The release layer 104 may include adhesive material, such as including adhesive that may be separated by laser, light or thermal cracking, but not limited herein. Then, as shown in FIG. 4, the protective layer 130 is formed to surround the plurality of first dies 110 and the plurality of second dies 120, and the protective layer 130 may cover the surfaces of the first dies 110 and the second dies 120. Then, after the protective layer 130 is formed, the release layer 104 and the carrier 102 may be removed, thereby forming the base layer 100 provided in Step S100.

As shown in FIG. 2 to FIG. 4, the plurality of second dies 120 may be respectively disposed at specific positions in the base layer 100, such as the positions of the base layer 100 where warpage is more likely to occur during the process, and the plurality of first dies 110 may be arranged as an array, for example, arranged as a plurality of rows extending along a direction X, and these rows are side by side along a direction Y. The direction X and the direction Y may be perpendicular to each other and both perpendicular to the normal direction of the electronic device, that is, a direction Z. The direction X may be parallel to the horizontal direction, and the direction Y may be perpendicular to the direction X, but not limited herein. In some embodiments, the plurality of second dies 120 may be respectively disposed on at least two corners of the base layer 100 and a center of the base layer 100, and the above at least two corners are respectively located at two ends of a diagonal line of the base layer 100. Taking the top view shown in FIG. 2 as an example, four of the second dies 120 may be respectively disposed on four corners of the base layer 100 (e.g., the upper-left corner, the upper-right corner, the lower-left corner and the lower-right corner of the base layer 100), and one of the second dies 120 may be disposed on the center of the base layer 100 or the central region of the base layer 100 (i.e., a position close to the center of the base layer 100), but the number and arrangement of the second dies 120 may be adjusted according to practical requirements, not limited herein. In some embodiments, two of the second dies 120 may be respectively disposed on two corners of two ends of the diagonal line of the base layer 100 (e.g., the upper-left corner and the lower-right corner of the base layer 100, or the upper-right corner and the lower-left corner of the base layer 100), and one of the second dies 120 may be disposed on the center or the central region of the base layer 100. In some embodiments, two of the second dies 120 may be respectively disposed on two corners of two ends of the diagonal line of the base layer 100, and two of the second dies 120 may be disposed on the central region of the base layer 100. The arrangement of the second dies 120 may be combined with the array of the first dies 110, that is, the arrangement position of each second die 120 may be located in the row of the array of the first dies 110 described above, but not limited herein. In some embodiments, the plurality of second dies 120 may be disposed in regions where the first dies 110 are not disposed to balance the stress, but not limited in.

Please refer to FIG. 3. The first die 110 may include a plurality of first conductive pads 112, the surface of the first die 110 with the first conductive pads 112 disposed thereon may be referred as an active surface 110a, and the first die 110 may further include a back surface 110b opposite to the active surface 110a. That is to say, the active surface 110a and the back surface 110b are located on opposite sides of the first die 110, and the plurality of first conductive pads 112 are disposed on the active surface 110a. The second die 120 may include a plurality of second conductive pads 122, the surface of the second die 120 provided with the second conductive pads 122 may be referred to as an active surface 120a, and the second die 120 may further include a back surface 120b opposite to the active surface 120a. That is to say, the active surface 120a and the back surface 120b are located on opposite sides of the second die 120, and the plurality of second conductive pads 122 are disposed on the active surface 120a. In some embodiments, the active surfaces 110a of the first dies 110 and the active surfaces 120a of the second dies 120 may be disposed in a face-down way, that is, the active surfaces 110a of the first dies 110 and the active surfaces 120a of the second dies 120 may face the carrier 102, but not limited herein. In other embodiments, the active surfaces 110a of the first dies 110 and the active surfaces 120a of the second dies 120 may be disposed in a face-up way, that is, the back surfaces 110b of the first dies 110 and the back surfaces 120b of the second dies 120 may face the carrier 102.

Please refer to FIG. 4. In some embodiments, as shown in FIG. 4, the protective layer 130 may cover the back surfaces 110b of the first dies 110 and the back surfaces 120b of the second dies 120. In other embodiments, the back surfaces 110b of the first dies 110 and the back surfaces 120b of the second dies 120 are not covered by the protective layer 130. For example, the protective layer 130 may expose the back surfaces 110b of the first dies 110 and the back surfaces 120b of the second dies 120 by a grinding process, thereby further improving the heat dissipation of the dies, but not limited herein.

In some embodiments, in a cross-sectional view of the electronic device shown as FIG. 3, each of the plurality of first dies 100 may have a width W1 along the direction X, each of the plurality of second dies 120 may have a width W2 along the direction X, and the width W2 of each of the plurality of second dies 120 along the direction X may be less than the width W1 of each of the plurality of first dies 110 along the direction X (i.e., W2<W1) to reduce the space occupied by the second dies 120 in the base layer 100, but not limited herein. In some embodiments, in a top view of the electronic device shown as FIG. 2, each of the plurality of first dies 100 may have a die area A1, each of the plurality of second dies 120 may have a die area A2, and the die area A2 of each of the plurality of second dies 120 may be less than or equal to the die area A1 of each of the plurality of first dies 110 (i.e., A2≤A1) to reduce the space occupied by the second dies 120 in the base layer 100. The "die area" herein may mean the area of an individual die or one single die in the top view shown as FIG. 2. In some embodiments, the plurality of first dies 110 may have different die areas, and the largest die area is chosen as the die area A1, and the die area A2 of the second die 120 may be less than or equal to the die area A1, but not limited herein.

In some embodiments, in the direction Z (i.e., the normal direction of the electronic device) shown as FIG. 3, each of the plurality of first dies 100 may have a thickness T1, each of the plurality of second dies 120 may have a thickness T2, and the thickness T2 of each of the plurality of second dies 120 may be less than or equal to the thickness T1 of each of the plurality of first dies 110 (i.e., T2≤T1). From the above design, the thickness T2 of the second dies 120 will not be too large, such that there is no need to thicken the protective layer 130 subsequently formed, or the thinner second dies 120 will not be easily damaged when grinding the protective layer 130. In some embodiments, the plurality of first dies 110 may have different thicknesses in the direction Z, and the largest thickness is chosen as the thickness T1, and the thickness T2 of the second die 120 may be less than or equal to the thickness T1, but not limited herein.

Figure 5:
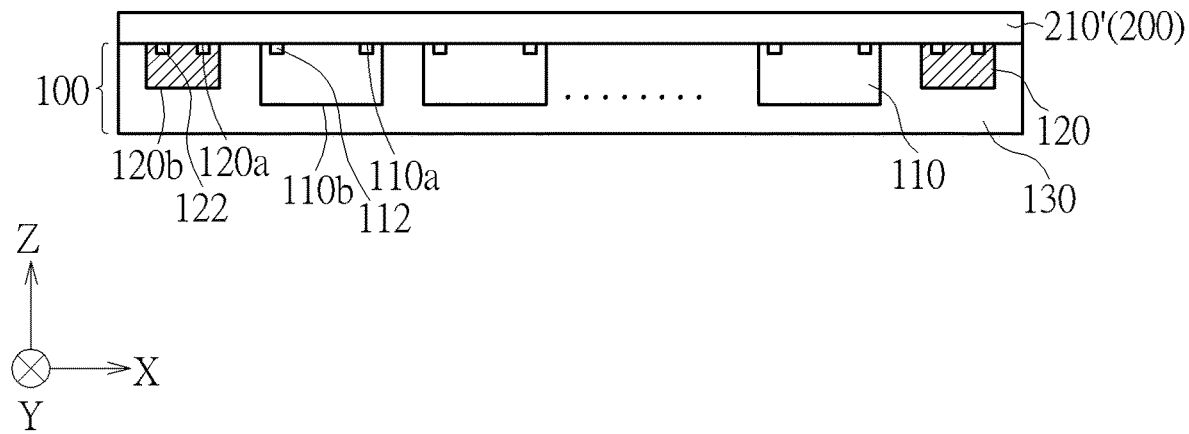
Figure 6:
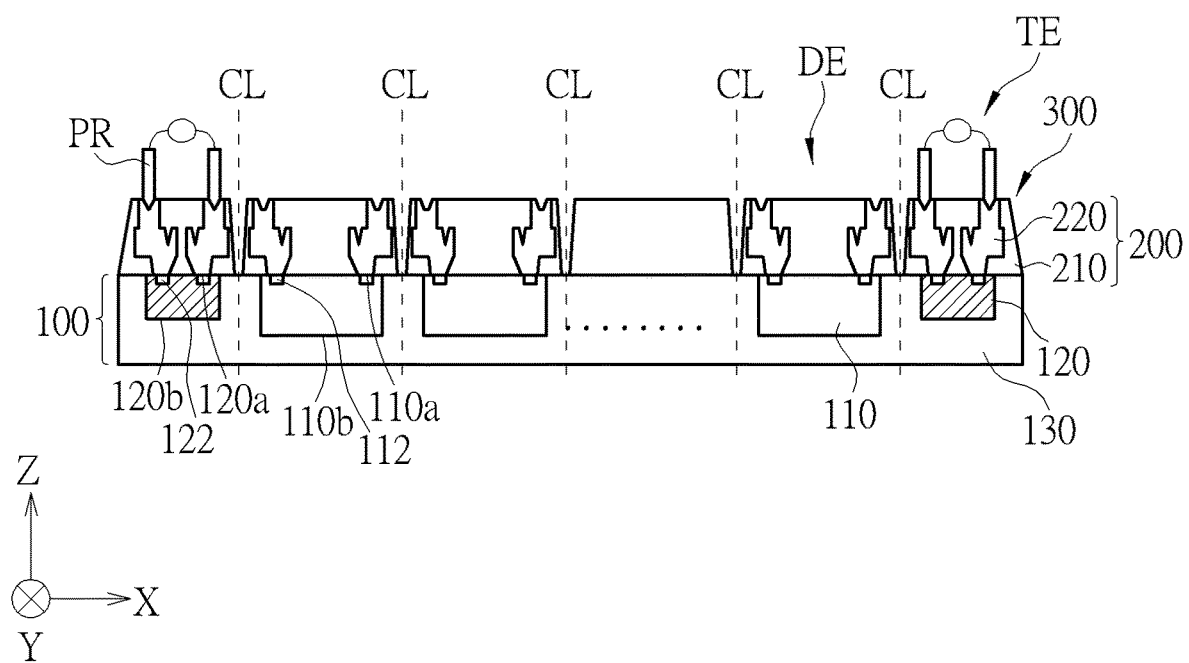

Step S200 may be performed after Step S100. As shown in Step S200, FIG. 5 and FIG. 6, a circuit layer 200 is formed on the base layer 100. FIG. 5 and FIG. 6 show the structure that the base layer 100 is further flipped upside-down after the release layer 104 and the carrier 102 are removed, so that the active surfaces 110a of the first dies 110 and the active surfaces 120a of the second dies 120 face upwards, which is beneficial to the following manufacturing of the circuit layer 200 on their surfaces. Specifically, the circuit layer 200 may be formed on the side where the active surfaces 110a of the first dies 110 and the active surfaces 120a of the second dies 120 are located. The circuit layer 200 may include at least one insulating layer and at least one conductive layer stacked in the direction Z to form a redistribution layer (RDL), so as to redistribute the circuit or further increase the fan-out area of the circuit. The entirety of the at least one insulating layer in the circuit layer 200 is represented by an insulating layer 210, and the entirety of the at least one conductive layer is represented by a conductive layer 220. For example, an insulating layer 210' (as shown in FIG. 5) may be formed on the base layer 100, and then the insulating layer 210' may be patterned. For example, through holes (not shown) may be formed in the insulating layer 210'. Then, a conductive layer may be formed on the insulating layer 210', and then the conductive layer may be patterned. The conductive layer may be filled in the through holes of the patterned insulating layer 210'. Then, the above steps of forming the patterned insulating layer and the patterned conductive layer may be repeated, so that at least one patterned insulating layer and at least one patterned conductive layer are alternately formed in sequence to manufacture the circuit layer 200 including the insulating layer 210 and the conductive layer 220, but not limited herein. The insulating layer 210 may include organic materials, inorganic materials or dielectric materials, such as polyimide (PI), epoxy and/or silicon dioxide, or other suitable materials, but not limited herein. The conductive layer 220 may include, for example, copper or other suitable conductive materials. The conductive layer 220 may include a seed layer and a metal layer, and the seed layer and the metal layer may include single-layer material or multi-layer materials, such as titanium, copper, molybdenum, aluminum, nickel, silver, tin or combinations of the above, but not limited herein. The seed layer contributes to the formation of the metal layer or improves adhesion, but not limited herein. The circuit layer 200 may further include active elements or passive elements, such as thin film transistors (TFTs), electrostatic discharge protection devices (ESDs) and/or capacitors, but not limited herein.

Step S300 may be performed after Step S200. As shown in Step S300, an electricity test is performed to confirm whether the circuit layer 200 is electrically connected to one of the plurality of second dies 120. For example, a probe PR shown in FIG. 6 may be used to perform the electricity test to the second die 120 for confirming whether the circuit layer 200 is electrically connected to the second die 120, thereby monitoring whether the condition of the process is normal, and further observing whether a portion of the first dies 110 adjacent to the tested second die 120 or all of the first dies 110 meet the standard, for example, whether the electrical signals are abnormal such as occurring the situations of short circuit, open circuit or excessive signal loss rate, but not limited herein. In some embodiments, the electricity test described in the present disclosure may be achieved by other contact tests, non-contact tests or other suitable tests, so as to confirm whether the elements, structures, and/or electrical connections of the second die 120 and the corresponding circuit layer 200 are in normal condition, thereby monitoring the performance of the process, and accordingly confirming whether the elements, structures, and/or electrical connections of the first dies 110 and the circuit layer 200 meet the standard.

Step S400 may be performed after Step S300. As shown in Step S400 and FIG. 6, the circuit layer 200 is cut to form a plurality of circuit structures 300. Specifically, the circuit layer 200 including the insulating layer 210 and the conductive layer 220 may be cut into the plurality of circuit structures 300, so that each of the circuit structures 300 may respectively correspond to one of the first dies 110 and the second dies 120, that is, each of the circuit structures 300 may correspond to the first die 110 or the second die 120 one by one, or each of the circuit structures 300 may be electrically connected to the first die 110 or the second die 120 one by one. Each of the circuit structures 300 may include a portion of the insulating layer 210 and a portion of the conductive layer 220 in the circuit layer 200, and each of the plurality of circuit structures 300 may be a redistribution structure, but not limited herein.

In some embodiments, the plurality of circuit structures 300 formed after cutting may be electrically isolated from each other, that is, the plurality of circuit structures 300 are separate structures and are not electrically connected to each other. In other embodiments, after cutting, a portion of the plurality of circuit structures 300 may be electrically connected to each other, such as (but not limited to) being electrically connected by a dummy line, and this portion of the plurality of circuit structures 300 may be electrically isolated from other portion of the plurality of circuit structures 300. For example, the circuit structure 300 corresponding to one of the second dies 120 may be electrically connected to another circuit structure(s) 300 corresponding to at least one of the first dies 110 adjacent to the second die 120, but these circuit structures 300 are electrically isolated from the other portion of circuit structures 300. Taking a region R1 and a region R2 marked by the dotted-frames in FIG. 2 as examples, the circuit structures 300 corresponding to the first dies 110 and one second die 120 in the region R1 may be electrically connected to each other, and the circuit structures 300 corresponding to the first dies 110 and one second die 120 in the region R2 may be electrically connected to each other, but the circuit structures 300 corresponding to the first dies 110 and the second die 120 in the region R1 is electrically isolated from the circuit structures 300 corresponding to the first dies 110 and the second die 120 in the region R2. However, the electrical connection relationship among the plurality of circuit structures 300 is not limited herein, which may be adjusted according to practical requirements.

Step S500 may be performed after Step S400. As shown in Step S500 and FIG. 6, another electricity test is performed to confirm whether one of the plurality of circuit structures 300 is electrically connected to one of the plurality of second dies 120. Specifically, the electricity test may be performed to the circuit structure 300 corresponding to one of the second die 120, such as (but not limited to) using the probe PR shown in FIG. 6 to perform the electricity test to the circuit structure 300 corresponding to the second die 120, so as to confirm whether the circuit structure 300 is electrically connected to the corresponding second die 120, thereby monitoring whether the condition of the process is normal, and further knowing whether a portion of the first dies 110 adjacent to the tested second die 120 or all of the first dies 110 meet the standard, for example, whether the electrical signals are abnormal such as including as short circuit, open circuit or excessive signal loss rate, but not limited herein. In some embodiments, the electricity test described in the present disclosure may be achieved by other contact tests, non-contact tests or other suitable tests, so as to confirm whether the elements, structures, and/or electrical connections of the second die 120 and the corresponding circuit structure 300 are in normal status, thereby monitoring the condition of the process, and accordingly confirming whether the elements, structures, and/or electrical connections of the first die 110 and the corresponding circuit structure 300 meet the standard. In some embodiments, it may be compared that whether the elements, structure and/or electrical connections of the plurality of second dies 120 and their corresponding circuit structures 300 are in normal condition or have the same electrical properties. For example, if the difference between the resistance of one second die 120 and the resistance of another second die 120 is within 20%, it is considered that they are in normal condition. By monitoring the condition of the process through the electrical characteristics of the dummy dies (i.e., the second dies 120), and accordingly confirming whether the elements, structures, and/or electrical connections of the first dies 110 and the corresponding circuit structures 300 meet the standard, the process stability may be improved and real-time monitoring may be achieved.

Taking the region R1 in FIG. 2 as an example, the electricity test may be performed to the circuit structure 300 corresponding to the second die 120 in the region R1 to confirm whether this circuit structure 300 is electrically connected to the corresponding second die 120 or has electricity performance complying with the requirement. When the tested circuit structure 300 is electrically connected to the corresponding second die 120 or the test result is good, it means that the condition of the process in the region R1 is normal, and it may be confirmed that the first dies 110 and the corresponding circuit structures 300 in the region R1 are good products. When the tested circuit structure 300 is not electrically connected to the corresponding second die 120 or has poor electricity performance, it means that the condition of the process in the region R1 is abnormal, so it is necessary to further test the first dies 110 and the corresponding circuit structures 300 in the region R1 or perform other corresponding procedures to solve the problem. Similarly, the corresponding electricity test may be performed on the region R2, the region R3 and the region R4 to monitor whether the condition of the process is normal, and to confirm whether the first dies 110 and the corresponding circuit structures 300 in each region are good products.

The second dies 120 in the region R1, the region R2, the region R3 and the region R4 may be disposed at the corners or the positions where warpage is more likely to occur during the process, and the second die 120 corresponding to the central region may be used to monitor the uniformity of the process. By performing the electricity test to the second dies 120 (e.g., dummy dies) and their corresponding circuit structures 300 instead of directly testing the first dies 110 (e.g., product dies) and their corresponding circuit structures 300, the condition of the process may be monitored during the manufacturing process, and the damage to the first dies 110 may be reduced, such as reducing the risk that the circuit structures 300 corresponding to the first dies 110 are scratched by the probe, thereby improving the quality and/or reliability of the products.

In some embodiments, the step of performing the electricity test may include providing a voltage to one of the plurality of circuit structures 300 (i.e., the circuit structure 300 corresponding to one of the second dies 120) to obtain a resistance value of one of the plurality of second dies 120. When the obtained resistance value is within a predetermined range, it means that this second die 120 and the corresponding circuit structure 300 are in normal condition, and at least one of the plurality of first dies 110 adjacent to this second die 120 and the corresponding circuit structure 300 may be confirmed as a good product. When the obtained resistance value is out of the predetermined range, it means that this second die 120 and the corresponding circuit structure 300 are abnormal, and it is necessary to further test the at least one first die 110 adjacent to this second die 120 and the corresponding circuit structure 300 or perform other corresponding procedures.

In some embodiments, the tested one of the plurality of second dies 120 may be electrically isolated from the plurality of first dies 110 when performing the electricity test. Specifically, when performing the electricity test, the provided signal is transmitted to the second die 120 only through the corresponding circuit structure 300, and this second die 120 is electrically isolated from the plurality of first dies 110. For example, the circuit structure 300 corresponding to this second die 120 is electrically isolated from the circuit structures 300 corresponding to the plurality of first dies 110, so that the signal may not be transmitted to the first dies 110. That is to say, the electricity test may be performed only to the second die 120 and its corresponding circuit structure 300. By confirming whether the second die 120 and its corresponding circuit structure 300 meet the predetermined standard, it may be used as a comparison sample to monitor and confirm whether a portion of the first dies 110 adjacent to the tested second die 120 or all of the first dies 110 and their corresponding circuit structures 300 meet the standard.

In some embodiments, one of the plurality of second dies 120 to be tested may be electrically connected to one of the plurality of first dies 110 when performing the electricity test. For example, the tested second die 120 may be electrically connected to one or plural first dies 110 adjacent to the tested second die 120. Specifically, when performing the electricity test, the provided signal is transmitted to the corresponding second die 120 through the circuit structure 300, and this second die 120 may be electrically connected to one or plural first dies 110. For example, the circuit structure 300 corresponding to this second die 120 is electrically connected to the circuit structure(s) 300 corresponding to adjacent one or plural first dies 110, so that the signal may be transmitted to the electrically connected first die(s) 110. That is to say, the signal may be transmitted to the first die(s) 110 through the circuit structures 300 that are electrically connected to each other when the electricity test is performed to the second die 120 and its corresponding circuit structure 300, but not limited herein.

Figure 7:
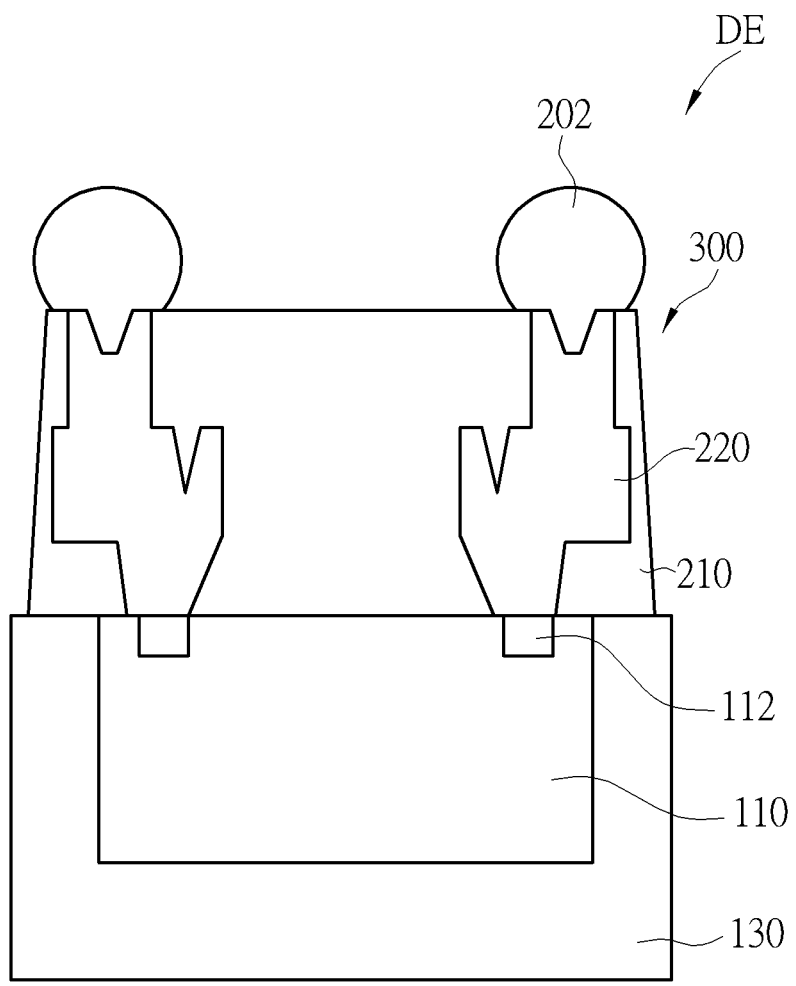
FIG. 7 is a cross-sectional schematic diagram of an electronic device according to an embodiment of the present disclosure.

According to the method for manufacturing the electronic device of the present disclosure, after Step S500 is performed, if the results of the electricity test meet the predetermined standard to confirmed that the condition of the process is normal, that is, it is confirmed that the second die 120 and its corresponding circuit structure 300 meet the standard or are not abnormal, a protective layer (not shown) may be optionally formed on the plurality of circuit structures 300 to surround the plurality of circuit structures 300, and the protective layer may expose the uppermost portion of the conductive layer 220 in each of the circuit structures 300. Then, a plurality of conductive elements (e.g., the conductive elements 202 shown in FIG. 7, FIG. 8 or FIG. 9) may be formed on the exposed conductive layer 220 in each of the circuit structures 300. For example, a conductive element may be formed on one of the plurality of circuit structures 300. Then, the base layer 100 may be cut along the cutting lines CL to obtain an electronic device DE including the first die 110, as shown in FIG. 7, which is a cross-sectional schematic diagram of an electronic device DE manufactured by a manufacturing method according to an embodiment of the present disclosure. For example, the electronic device DE may include a first die 110, a protective layer 130 surrounding the first die 110, a circuit structure 300 and optional conductive elements 202. The conductive elements 202 are disposed on and electrically connected to the exposed conductive layer 220 in the circuit structure 300 to serve as bonding elements of the electronic device DE. The conductive element 202 may be, for example, a bump, a pad, a solder ball or other suitable bonding elements. The conductive element 202 may include, for example, copper, tin, nickel, gold, lead, other suitable conductive materials or combinations of the above materials, but not limited to the above. In addition, the conductive elements 202 of the electronic device DE may be further electrically connected to a circuit board (not shown), but not limited herein.

Figure 8:
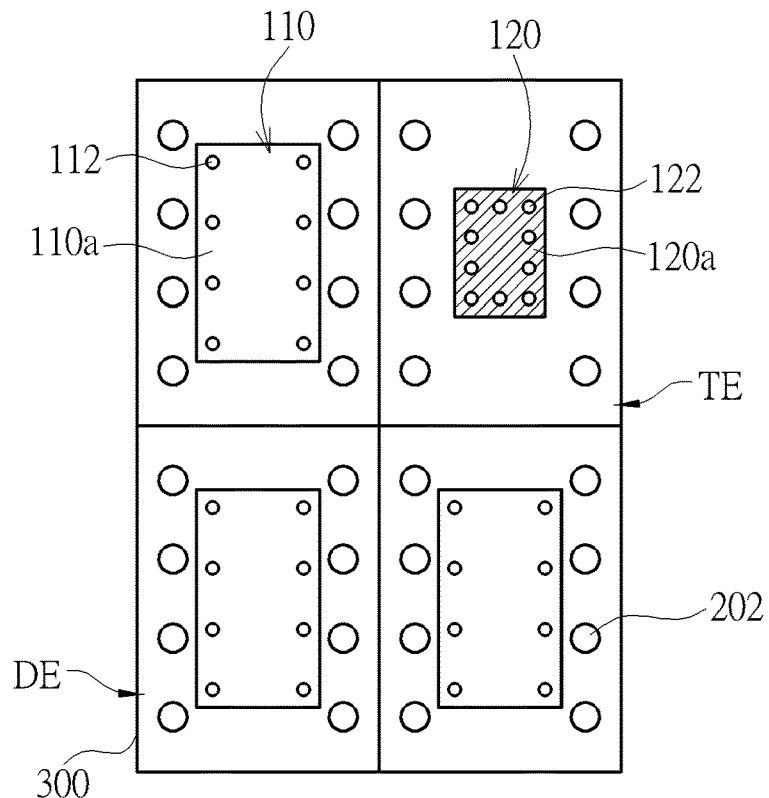
FIG. 8 is a top-view schematic diagram of first dies and a second die according to an embodiment of the present disclosure.
Figure 9:
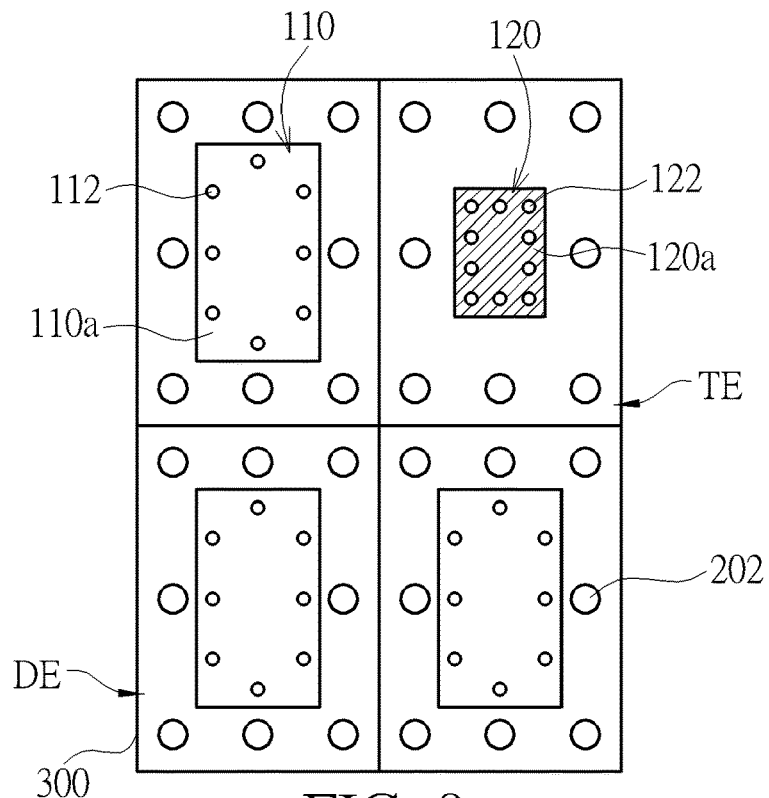
FIG. 9 is a top-view schematic diagram of first dies and a second die according to another embodiment of the present disclosure.

Please refer to FIG. 8 and FIG. 9. FIG. 8 is a top-view schematic diagram of first dies and a second die according to an embodiment of the present disclosure. FIG. 9 is a top-view schematic diagram of first dies and a second die according to another embodiment of the present disclosure, wherein FIG. 8 and FIG. 9 may be, for example, partially enlarged schematic diagrams of the elements shown in FIG. 6. As shown in FIG. 8 and FIG. 9, in some embodiments, one of the plurality of first dies 100 may include a plurality of first conductive pads 112, and the first die 110 may be electrically connected to one of the plurality of circuit structures 300 through the plurality of first conductive pads 112, that is, one first die 110 is electrically connected to its corresponding circuit structure 300 located on its upper side through the first conductive pads 112. In the embodiment shown in FIG. 8, the plurality of first conductive pads 112 may be disposed on opposite two sides of the active surface 110a as two columns, for example. In the embodiment shown in FIG. 9, the plurality of first conductive pads 112 may be disposed on the active surface 110a in a ring shape, for example, or the first conductive pads 112 may be disposed on four sides (including the long sides and the short sides) of the active surface 110a. However, the arrangement of the first conductive pads 112 is not limited to the above, that is, the first conductive pads 112 in the first die 110 may be disposed on the active surface 110a in different ways according to the required practical designs. According to the present disclosure, in order to make the second conductive pads 122 of the second die 120 applicable and corresponding to various designs of the first conductive pads 112 of the first die 110, one of the plurality of second dies 120 may include a plurality of second conductive pads 122, and a number of the plurality of second conductive pads 122 may be different from a number of the plurality of first conductive pads 112, or the number of the plurality of second conductive pads 122 may be greater than the number of the plurality of first conductive pads 112.

That is to say, by making the number of the second conductive pads 122 of one second die 120 greater than the number of the first conductive pads 112 of one first die 110, suitable second conductive pads 122 may be selected to be electrically connected to the corresponding circuit structure 300, thereby increasing the flexibility of applying the second die 120 to different product processes. For example, the second conductive pads 122 may be disposed on the active surface 120a with the arrangement pattern as shown in FIG. 8 and FIG. 9, so that the second die 120 may be suitable for monitoring the condition of the process of the first dies 110 as shown in FIG. 8 and the condition of the process of the first dies 110 as shown in FIG. 9. In some embodiments, the second die 120 may be electrically connected to the corresponding circuit structure 300 through at least a portion of the second conductive pads 122, that is, the portion of the second conductive pads 122 may correspond to the design of the first conductive pads 112 of the first die 110 to be monitored, and the other portion of the second conductive pads 122 are not used for electrical connection, but not limited herein. Through the electrical connection of the portion of the second conductive pads 122 and the corresponding circuit structure 300 described above, the second die 120 and the corresponding circuit structure 300 constitute a testing electronic device (or referred to as a dummy electronic device) TE for testing. Therefore, in the above Step S500, the electricity test may be performed on the testing electronic device TE including the second die 120 to monitor the electricity performance of other electronic devices DE including the first dies 110.

As shown in FIG. 8 and FIG. 9, the electronic device DE and the testing electronic device TE may further include conductive elements 202 on the surfaces thereof. For example, the conductive elements 202 may be formed on the surface of the circuit layer 200 or the circuit structure 300 and electrically connected to the exposed conductive layer 220 in the circuit structure 300. The conductive elements 202 may be used as the bonding elements of the electronic device DE, as shown in FIG. 7, but not limited herein.

Figure 10:
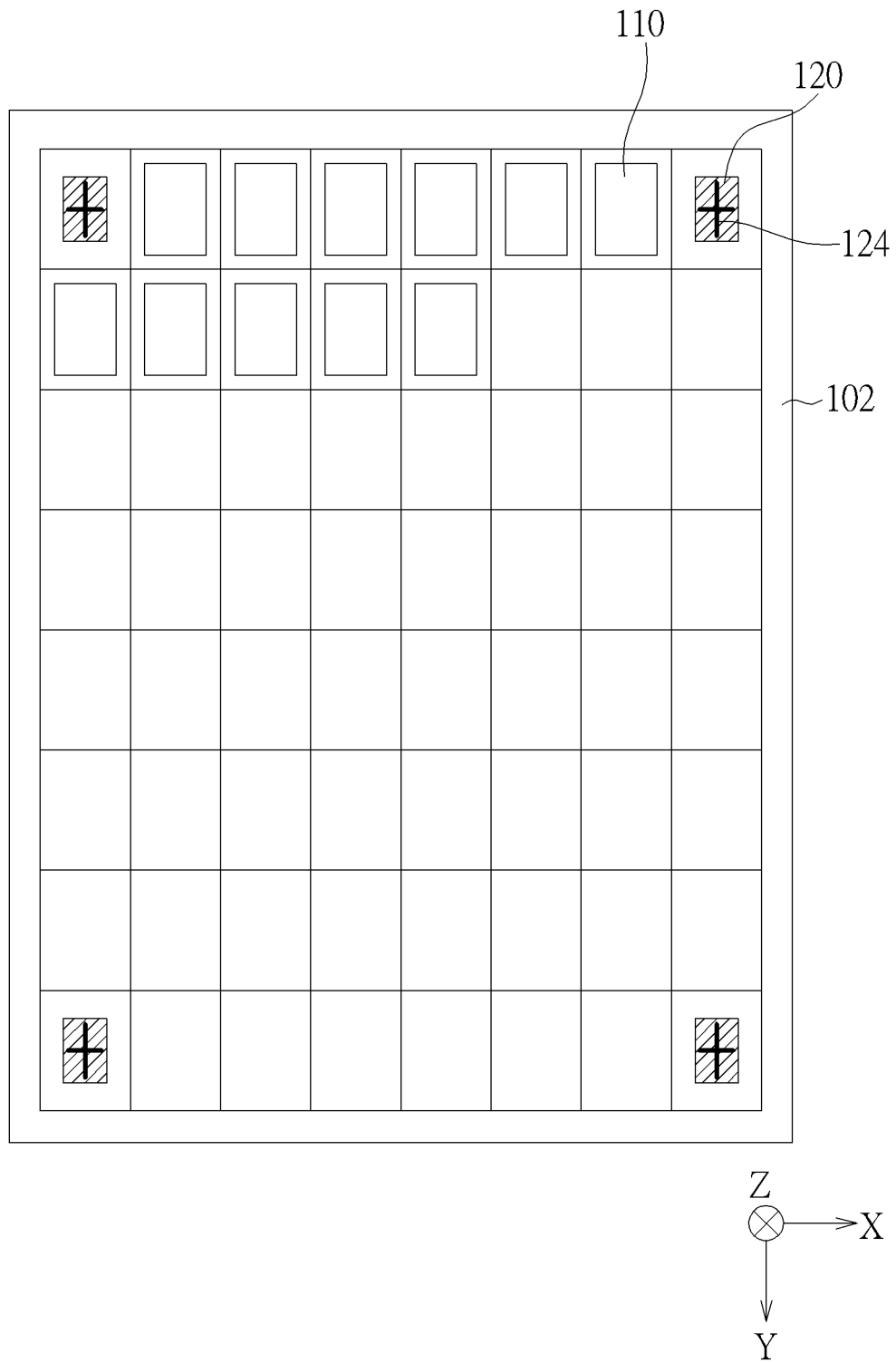
FIG. 10 is a schematic diagram illustrating a part of the process of a method for manufacturing an electronic device according to an embodiment of the present disclosure.

Please refer to FIG. 10. FIG. 10 is a schematic diagram illustrating a part of the process of a method for manufacturing an electronic device according to an embodiment of the present disclosure. As shown in FIG. 10, in some embodiments, each of the plurality of second dies 120 may include an alignment mark 124. The alignment may be performed according to the alignment mark 124 of the at least one second die 120 when disposing the first die 110, so as to improve the accuracy of alignment in the process, thereby improving the utilization rate of the carrier 102. Specifically, the process of forming the base layer 100 may include the following steps, for example. At first, the plurality of second dies 120 are disposed on a carrier 102, such as (but not limited to) disposed at four corners of the carrier 102. Then, the plurality of first dies 110 are disposed on the carrier 102 according to the alignment marks 124 of the plurality of second dies 120. For example, in FIG. 10, the first dies 110 disposed on the upper-left of the carrier 102 may be aligned according to the alignment mark 124 of the second die 120 on the upper-left, and the first dies 110 disposed on the upper-right of the carrier 102 may be aligned according to the alignment mark 124 of the second die 120 on the upper-right, so that the plurality of first dies 110 may be substantially disposed as an array along the direction X and the direction Y (the arrangement may be referred to FIG. 2). After the plurality of first dies 110 are disposed, a protective layer 130 (as shown in FIG. 4) may be formed to surround the plurality of first dies 110 and the plurality of second dies 120. Then, the carrier 102 may be removed, thereby forming the base layer 100.

In some embodiments, when the active surfaces 120a of the plurality of second dies 120 face the carrier 102 (as shown in FIG. 3), each of the alignment marks 124 may be respectively formed on the back surface 120b of each of the plurality of second dies 120. For example, the alignment mark 124 may be formed on the back surface 120b of the second die 120 by an etching process or other suitable processes. Therefore, the alignment marks 124 may be used for the alignment when disposing the first dies 110 subsequently, but not limited herein. In some embodiments, when the back surfaces 120b of the plurality of second dies 120 face the carrier 102, each of the alignment marks 124 may be respectively formed on the active surface 120a of each of the plurality of second dies 120. For example, the alignment mark 124 may be formed on the active surface 120a of the second die 120 by an etching process or other suitable processes.

From the above description, according to the methods for manufacturing the electronic device of the embodiments of the present disclosure, by disposing the second dies, the condition of the process of the first dies may be monitored during the manufacturing process, thereby improving the quality and/or reliability of products. In the present disclosure, the first die is an element included in the electronic device to be manufactured, and the second die may be regarded as a dummy die used for the electricity test. Therefore, when performing the test, the testing electronic device including the second die may be tested without directly testing the circuit structure or the first die in the product electronic device, thereby reducing the probability of damaging the product electronic device due to the electricity test. In addition, by disposing the second dies including the alignment mark, the accuracy of alignment for the first dies in the process may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing an electronic device, comprising following steps:
   providing a base layer, wherein the base layer comprises a plurality of first dies and a plurality of second dies, and a number of the plurality of first dies is greater than a number of the plurality of second dies;
   forming a circuit layer on the base layer; and
   performing an electricity test to confirm whether the circuit layer is electrically connected to one of the plurality of second dies,
   wherein each of the plurality of second dies comprises an alignment mark, and forming the base layer comprises following steps:
   disposing the plurality of second dies on a carrier;

disposing the plurality of first dies on the carrier, wherein at least one of the plurality of second dies is surrounded by at least eight of the plurality of first dies;

forming a protective layer to surround the plurality of first dies and the plurality of second dies; and removing the carrier.

2. The method for manufacturing the electronic device according to claim 1, wherein in a cross-sectional view of the electronic device, a width of each of the plurality of second dies along a direction is less than a width of each of the plurality of first dies along the direction.

3. The method for manufacturing the electronic device according to claim 1, further comprising following steps:

cutting the circuit layer to form a plurality of circuit structures; and performing another electricity test to confirm whether one of the plurality of circuit structures is electrically connected to the one of the plurality of second dies.

4. The method for manufacturing the electronic device according to claim 3, wherein the step of performing another electricity test comprises providing a voltage to the one of the plurality of circuit structures to obtain a resistance value of the one of the plurality of second dies.

5. The method for manufacturing the electronic device according to claim 4, wherein when the resistance value is within a predetermined range, at least one of the plurality of first dies adjacent to the one of the plurality of second dies and the corresponding circuit structure are confirmed as a good product.

6. The method for manufacturing the electronic device according to claim 3, further comprising forming a conductive element on the one of the plurality of circuit structures after the step of performing another electricity test.

7. The method for manufacturing the electronic device according to claim 3, further comprising cutting the base layer after the step of performing another electricity test.

8. The method for manufacturing the electronic device according to claim 3, wherein each of the plurality of circuit structures is a redistribution structure.

9. The method for manufacturing the electronic device according to claim 1, wherein one of the plurality of first dies comprises a plurality of first conductive pads, the one of the plurality of second dies comprises a plurality of second conductive pads, and a number of the plurality of second conductive pads is different from a number of the plurality of first conductive pads.

10. The method for manufacturing the electronic device according to claim 1, wherein the plurality of first dies are disposed on the carrier according to the alignment marks of the plurality of second dies.

11. The method for manufacturing the electronic device according to claim 10, wherein each of the plurality of second dies comprises a plurality of conductive pads disposed on an active surface and a back surface opposite to the active surface, wherein the active surfaces of the plurality of second dies face the carrier, and each of the alignment marks is respectively formed on the back surface of each of the plurality of second dies.

12. The method for manufacturing the electronic device according to claim 10, wherein each of the plurality of second dies comprises a plurality of conductive pads disposed on an active surface and a back surface opposite to the active surface, wherein the back surfaces of the plurality of second dies face the carrier, and each of the alignment marks is respectively formed on the active surface of each of the plurality of second dies.

13. The method for manufacturing the electronic device according to claim 1, wherein the plurality of second dies are respectively disposed on at least two corners of the base layer and a central region of the base layer, wherein the at least two corners are respectively located at two ends of a diagonal line of the base layer.

14. The method for manufacturing the electronic device according to claim 1, wherein in a top view of the electronic device, a die area of each of the plurality of second dies is less than or equal to a die area of each of the plurality of first dies.

15. The method for manufacturing the electronic device according to claim 1, wherein in a normal direction of the electronic device, a thickness of each of the plurality of second dies is less than or equal to a thickness of each of the plurality of first dies.

16. The method for manufacturing the electronic device according to claim 1, wherein the one of the plurality of second dies is electrically isolated from the plurality of first dies when performing the electricity test.

17. The method for manufacturing the electronic device according to claim 1, wherein the one of the plurality of second dies is electrically connected to one of the plurality of first dies when performing the electricity test.

18. The method for manufacturing the electronic device according to claim 13, wherein an extending line penetrates the at least two of the plurality of second dies respectively disposed on the at least two corners of the base layer and the one of the plurality of second dies disposed at the central region of the base layer.

* * * * *